United States Patent [19]

Liu

[11] Patent Number: 5,557,228
[45] Date of Patent: Sep. 17, 1996

[54] FOUR-QUADRANT MULTIPLIER

[75] Inventor: Shen-Iuan Liu, Keelung, Taiwan

[73] Assignee: National Science Council, Taipei, Taiwan

[21] Appl. No.: 506,914

[22] Filed: Jul. 26, 1995

[51] Int. Cl.[6] ........................................ H03B 19/00
[52] U.S. Cl. ........................ 327/355; 327/357; 327/359; 327/105; 327/113; 327/119; 455/333
[58] Field of Search ........................................ 327/116, 119, 327/355, 356, 357, 359, 433, 113, 103, 105; 455/333, 326, 330

[56] References Cited

U.S. PATENT DOCUMENTS 5,151,625  9/1992  Zarabadi et al. ........................ 322/356
5,196,742  3/1993  McDonald ............................... 327/105

Primary Examiner—Timothy P. Callahan
Assistant Examiner—Dinh T. Le
Attorney, Agent, or Firm—Spencer & Frank

[57] ABSTRACT

A four-quadrant multiplier using BiCMOS circuits can be applied in high-frequency analog circuits. The four-quadrant multiplier includes two transform circuits to generate two intermediate signals proportional to the first and second input signals, respectively; four square circuits to provide a squaring relationship between current and voltage in the four square circuits; and two resistors serving as a load for the currents of the four square means and for outputting the resultant voltage to an output port.

12 Claims, 4 Drawing Sheets

FOUR-QUADRANT MULTIPLIER

BACKGROUND OF THE INVENTION

1. Field of the Invention

The present invention is in general related to an integrated circuit. More specifically, the present invention is related to a four-quadrant multiplier, which employs BiCMOS (Bipolar-Complementary MOS) devices and can be utilized in applications of high-frequency operation.

2. Description of the Prior Art

Multipliers are very essential components serving as building blocks for a large number of applications, such as adaptive filters, frequency doublers, and modulators. The operation of a four-quadrant multiplier, which is a kind of multiplier, involves receiving a first input signal $V_1$, a second input signal $V_2$, a third input signal $V_3$, and a fourth input signal, yielding a product signal $V_4$, which is the result of multiplication operation of the voltage differences $V_1-V_2$ and $V_3-V_4$.

In bipolar transistor technology, Gilbert cells are usually used to build a four-quadrant multiplier. But in MOS transistor technology, four approaches have emerged. The first approach, similar to the case of bipolar technology, is to use Gilbert cells to build a four-quadrant multiplier. The second approach is to use the properties of MOS transistors operated in the saturation region to design multipliers. The saturation region is also called an active region, where the drain current value is proportional to the square of the gate-drain voltage value. The third approach is to use the properties of MOS transistors operated in the linear region to design multipliers. The linear region is also called a triode region, where the drain current value is linearly proportional to the gate-source voltage when the drain-source voltage is a constant. The fourth or last approach uses the properties of MOS transistors operated in the subthreshold region to design multipliers.

On the other hand, the emergence of BiCMOS ICs comprising bipolar and MOS transistors offers a new opportunity to improve the performance of integrated circuits. BiCMOS makes it possible to implement circuits with high densities, like CMOS, which consume less power than bipolar ICs, but which offer speeds faster than those possible with CMOS alone.

SUMMARY OF THE INVENTION

Therefore, the first object of the present invention is to provide a novel four-quadrant multiplier using BiCMOS devices, which has both the advantages of bipolar technologies, such as their high-speed properties, and CMOS technologies, such as their low-power consumption. The performance of this scheme is shown to be superior to that of the prior art.

The second object of the present invention is to provide a novel four-quadrant multiplier using BiCMOS devices, which has high-speed performance in order to handle high frequency analog signals.

The third object of the present invention is to provide a novel four-quadrant multiplier using BiCMOS devices, which employs a minimum quantity of devices to fulfill the above-mentioned objects.

With respect to the above objects, the present invention provides a four-quadrant multiplier comprising a reference high potential; a reference low potential; a first transform means receiving the first input signal and outputting a first intermediate signal; a second transform means receiving the second input signal outputting a second intermediate signal, and the voltage difference between the first input signal and the second signal being proportional to that between the first intermediate signal and the second intermediate signal; a first square means coupled between a positive terminal of the output port and the reference low potential, and the square value of a voltage difference between the third input signal and the first intermediate signal subtracted by a reference voltage being proportional to a first output current of the first square means; a second square means coupled between a negative terminal of the output port and the reference low potential, and the square value of a voltage difference between the third input signal and the second intermediate signal subtracted by the reference voltage being proportional to a second output current of the second square means; a third square means, coupled between a positive terminal of the output port and the reference low potential, and the square value of a voltage difference between the fourth input signal and the first intermediate signal subtracted by the reference voltage being proportional to a third output current of the third square means; a fourth square means coupled between a negative terminal of the output port and the reference low potential, and the square value of a voltage difference between the fourth input signal and the second intermediate signal subtracted by the reference voltage being proportional to a fourth output current of the fourth square means; a first load coupled between the reference high potential and the positive terminal of the output port and serving as a load for the first output current and the fourth output current; a second load coupled between the reference high potential and the negative terminal of the output port, serving as a load for the second output current and the third output current, and the resistance of the second load means being equal to that of the first load means.

The present invention also provides another type of a four-quadrant multiplier comprising: a reference high potential; a reference low potential; a first transform means receiving the first input signal and outputting a first intermediate signal; a second transform means receiving the second input signal outputting a second intermediate signal, and the voltage difference between the first input signal and the second signal being proportional to that between the first intermediate signal and the second intermediate signal; a first square means coupled between a negative terminal of the output port and the reference high potential, the square value of a voltage difference between the third input signal and the first intermediate signal subtracted by a reference voltage being proportional to a first output current of the first square means; a second square means coupled between a positive terminal of the output port and the reference high potential, and the square value of a voltage difference between the third input signal and the second intermediate signal subtracted by the reference voltage being proportional to a second output current of the second square means; a third square means coupled between a positive terminal of the output port and the reference high potential, and the square value of a voltage difference between the fourth input signal and the first intermediate signal subtracted by the reference voltage being proportional to a third output current of the third square means; a fourth square means coupled between a negative terminal of the output port and the reference high potential, and the square value of a voltage difference between the fourth input signal and the second intermediate signal subtracted by the reference voltage being proportional to a fourth output current of the fourth square means; a first load coupled between the reference low potential and the positive terminal of the output port and serving as a load for the second output current and the third output current; a second load coupled between the reference low potential and the negative terminal of the output port, serving as a load for the first output current and the fourth output current, and the resistance of the second load means being equal to that of the first load means.

BRIEF DESCRIPTION OF THE DRAWINGS

The detailed description of an embodiment of the present invention is made with reference to the accompanying drawing, wherein.

DETAILED DESCRIPTION OF PREFERRED EMBODIMENTS

Figure 1:
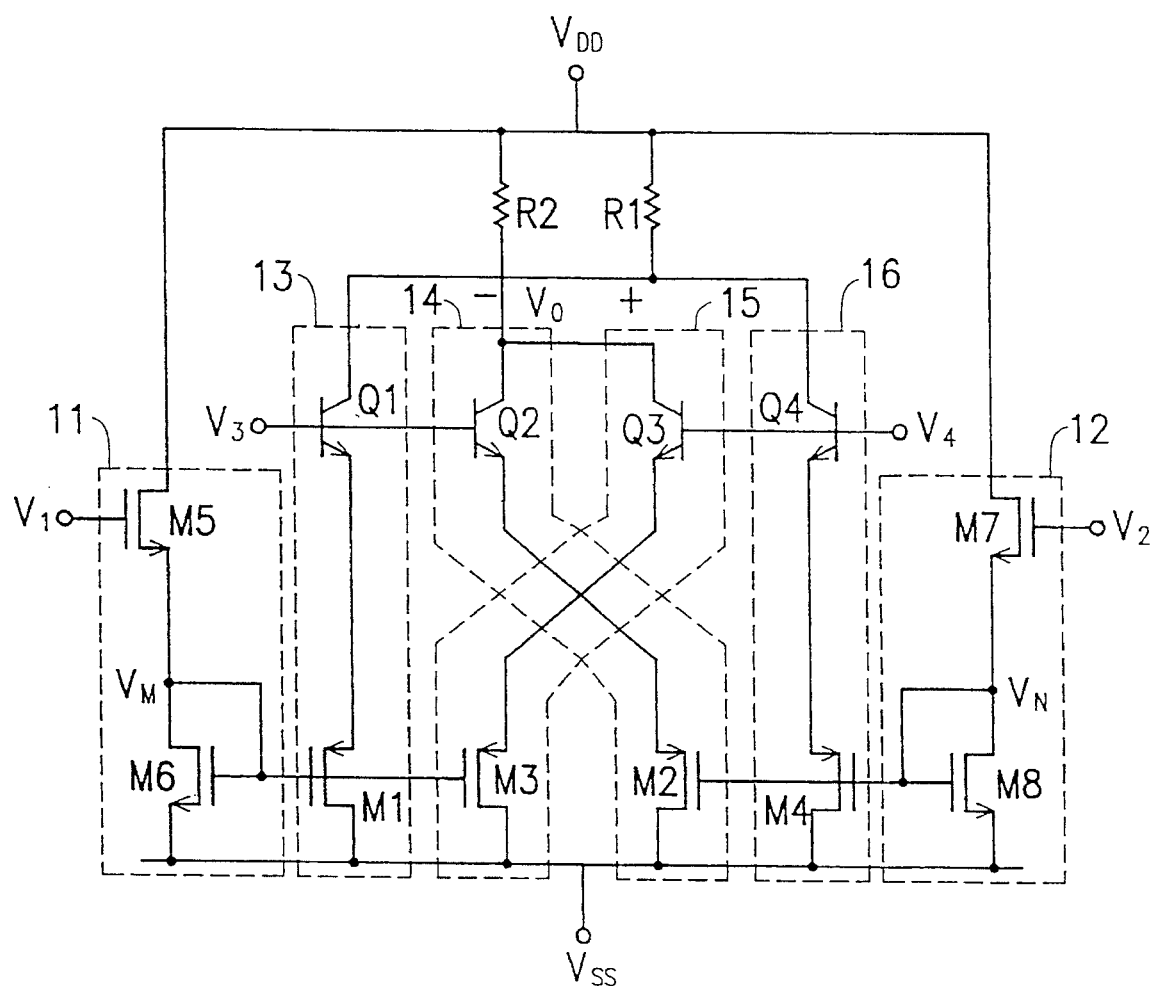
FIG. 1 is a circuit diagram of an example in an embodiment according to the present invention.

Refer to FIG. 1, which is a circuit diagram showing an example of the four-quadrant multiplier according to the present invention. This four-quadrant multiplier is coupled between a reference high potential $V_{DD}$ and a reference low potential $V_{SS}$. It is composed of four bipolar transistors Q1–Q4, eight MOS transistors M1–M8, and two resistors R1 and R2. All the bipolar transistors are operated in the active region, while all the MOS transistors are operated in the saturation region. When a bipolar transistor is operated in the active region, the base-to-emitter voltage $V_{BE}$ remains constant and the collector current $I_C$ is proportional to the base current $I_B$; on the other hand, when a MOS transistor is operated in the saturation region, the relationship of the drain current and the gate-source voltage $V_{GS}$ can be expressed as:

$$I_D = K(V_{GS} - V_T)^2 \qquad (1)$$

wherein the parameters K and $V_T$ are the transconduction parameter and the threshold voltage of a MOS transistor. Based on Equation (1), in a MOS transistor operated in the saturation region, we can state that the current is proportional to the square value of the voltage.

In FIG. 1, the four-quadrant multiplier consists of a first transform circuit 11 (composed of the transistors M5 and M6), a second transform circuit 12 (composed of the transistors M7 and M8), a first square circuit 13 (composed of the transistors Q1 and M1), a second square circuit 14 (composed of the transistors Q2 and M2), a third square circuit 15 (composed of the transistors Q3 and M3), a fourth square circuit 16 (composed of the transistors Q4 and M4), and two load resistors R1 and R2. As shown in FIG. 1, the first transform circuit 11 receives the first input signal $V_1$ and sends outside the first intermediate signal $V_M$; on the other hand, the second transform circuit 12 receives the second input signal $V_2$ and sends outside the second intermediate signal $V_N$. The realized function of both of the transform circuits is to make the voltage difference of the signals $V_M$ and $V_N$ proportional to the voltage difference of the signals $V_1$ and $V_2$. The first square circuit 13 is coupled to positive terminal of the output port $V_0$. The realized function of the first square circuit 13 is to make the output current proportional to the square value of the result of the voltage $V_3$ reduced or subtracted by the signals $V_M$ and a reference voltage. The second, third, and fourth square circuits 14, 15, 16 work like the first square circuit 13. The load resistor R1, coupled to the positive terminal of the output port $V_0$, serves as the load device of the current from the first square circuit 13 and the fourth square circuit 16. On the other hand, the load resistor R2, coupled to the negative terminal of the output port $V_0$, serves as the load device of the current from the second square circuit 14 and the third square circuit 15. The detailed description of the operation in the four-quadrant multiplier of this embodiment shown in FIG. 1 is described below.

In the embodiment shown in FIG. 1, the MOS transistors M5, M6, M7, M8 have the same threshold voltage parameters. However, the transistors M5, M6 and M7, M8 must be formed in different wells to reduce the body effect, therefore, the symbol $K_5$ represents the transconductance parameter of both the transistors M5 and M7 and the symbol $K_6$ represents the transconductance parameter of both the transistors M6 and M8. According to the fact that all MOS transistors are operated in the saturation region and the relationship of the voltage and current of Equation (1), we deduce:

$$V_1 - V_2 = \left(1 + \sqrt{\frac{K_6}{K_5}}\right)(V_M - V_N) \qquad (2)$$

Equation (2) states that the voltage difference of the first input signal $V_1$ and the second input signal $V_2$ is proportional to that of the first intermediate signal $V_M$ and the second intermediate signal $V_N$.

The first square circuit 13 comprises an NPN bipolar transistor Q1 and a PMOS transistor M1. When the NPN transistor Q1 is operated in the active region, the base-emitter voltage $V_{BE1}$ still remains constant, as described above. Therefore, the source-gate voltage can be expressed as:

$$V_{SG1} = V_3 - V_{BE1} - V_M \qquad (3)$$

As a result, the output current $I_1$ of the first square circuit 13 can be expressed as:

$$I_1 = K_1(V_3 - V_{BE1} - V_M - V_{TP1})^2 \qquad (4)$$

wherein the parameters $K_1$ and $V_{TP1}$ represent the transconductance and the threshold voltage of the MOS transistor M1. The square value of the voltage difference between the third input signal $V_3$ and the first intermediate signal $V_M$, after being reduced or subtracted by a reference voltage ($V_{BE1}$ and $V_{TP1}$), is proportional to the current $I_D$. The second square circuit 14, the third square circuit 15, and the fourth square circuit 16, receiving signal pairs ($V_3$, $V_N$), ($V_4$, $V_M$), and ($V_4$, $V_N$), comprise the bipolar transistors Q2, Q3, Q4 and the MOS transistors M2, M3, M4, respectively. Based on Equation (4), the output currents $I_2$, $I_3$, and $I_4$ of the second, third, and fourth square circuits can be expressed as:

$$I_2 = K_2(V_3 - V_{BE2} - V_N - V_{TP2})^2 \qquad (5)$$

$$I_3 = K_3(V_4 - V_{BE3} - V_M - V_{TP3})^2 \qquad (6)$$

$$I_4 = K_4(V_4 - V_{BE4} - V_N - V_{TP3})^2 \qquad (7)$$

In Equations (4), (5), (6), and (7), the parameters $V_{BEi}$ (I=1,2,3,4) represent the base-emitter voltage of bipolar transistors Q1–Q4, respectively. According to the fundamental operating principle of bipolar transistors, the transistors Q1–Q4 should have relatively similar base-emitter voltages, which can be represented by the symbol $V_{BE}$. On the other hand, the PMOS transistors M1–M4 can be formed in the same well so that they also have the same threshold voltage and the transconductance, represented by symbols $V_{TP}$ and K. As a result, Equations (4)–(7) can be transformed into:

$$I_1 = K(V_3 - V_{BE} - V_M - V_{TP})^2 \quad (4')$$

$$I_2 = K(V_3 - V_{BE} - V_N - V_{TP})^2 \quad (5')$$

$$I_3 = K(V_4 - V_{BE} - V_M - V_{TP})^2 \quad (6')$$

$$I_4 = K(V_4 - V_{BE} - V_N - V_{TP})^2 \quad (7')$$

The load resistor that is coupled between the reference high potential $V_{DD}$ and the positive terminal of the output port $V_0$ serves as a load for the currents $I_1$ and $I_4$. The load resistor that is coupled between the reference high potential $V_{DD}$ and the negative terminal of the output port $V_0$ serves as a load for the currents $I_2$ and $I_3$. Here the load resistors R1 and R2 have the same resistance, represented by the symbol $R_L$. Therefore, the output port voltage $V_0$ can be expressed as:

$$\begin{aligned} V_0 &= R_L(I_2 + I_3 - I_1 - I_4) \quad (8) \\ &= \frac{2K}{1 + \sqrt{\frac{K_6}{K_5}}} + R_L(V_3 - V_4)(V_1 - V_2) \end{aligned}$$

Finally, the output port voltage $V_0$ is the four-quadrant product of the input signals $V_1$, $V_2$, $V_3$, $V_4$.

Figure 2:
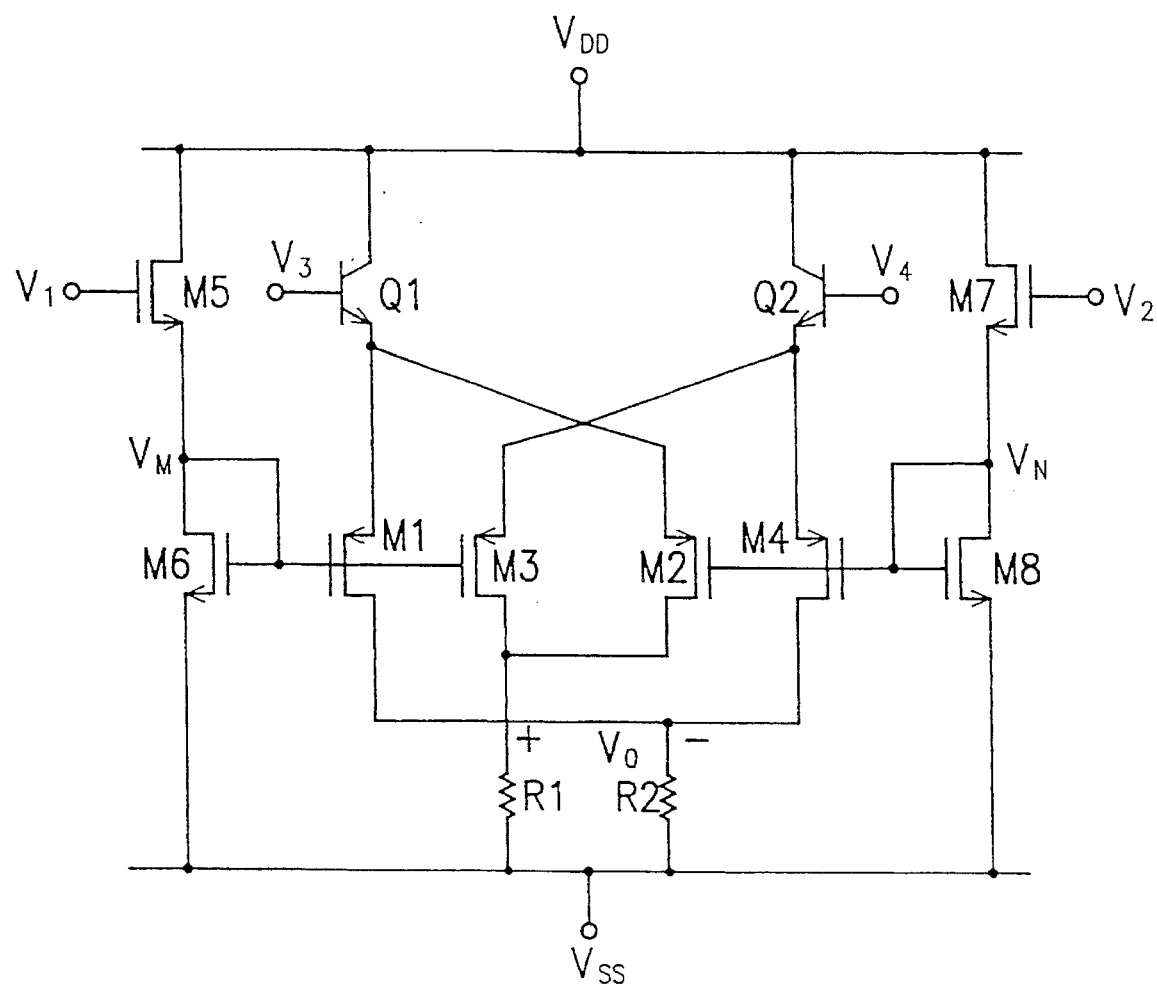
FIG. 2 is a circuit diagram of another example in another embodiment according to the present invention.

FIG. 2 shows another circuit diagram according to the four-quadrant multiplier of the present invention. Compared with the circuit diagram shown in FIG. 1, two differences can be found. The first is that the configuration of FIG. 1 uses less components. The first square circuit (composed by the transistors Q1 and M1) and the second square circuit (composed by the transistors Q1 and M2) have the NPN bipolar transistor Q1 in common. The third square circuit (composed by the transistors Q2 and M3) and the fourth square circuit (composed by the transistors Q2 and M4) have the NPN bipolar transistor Q2 in common. Thus, overall, two bipolar transistors can be eliminated. The second difference is that the locations of the load resistors R1 and R2 are different. Both of the loads R1 and R2 are coupled to the reference low potential $V_{SS}$. Following the same procedure, the performance of the circuit shown in FIG. 2 is consistent with Equation (8).

Figure 3:
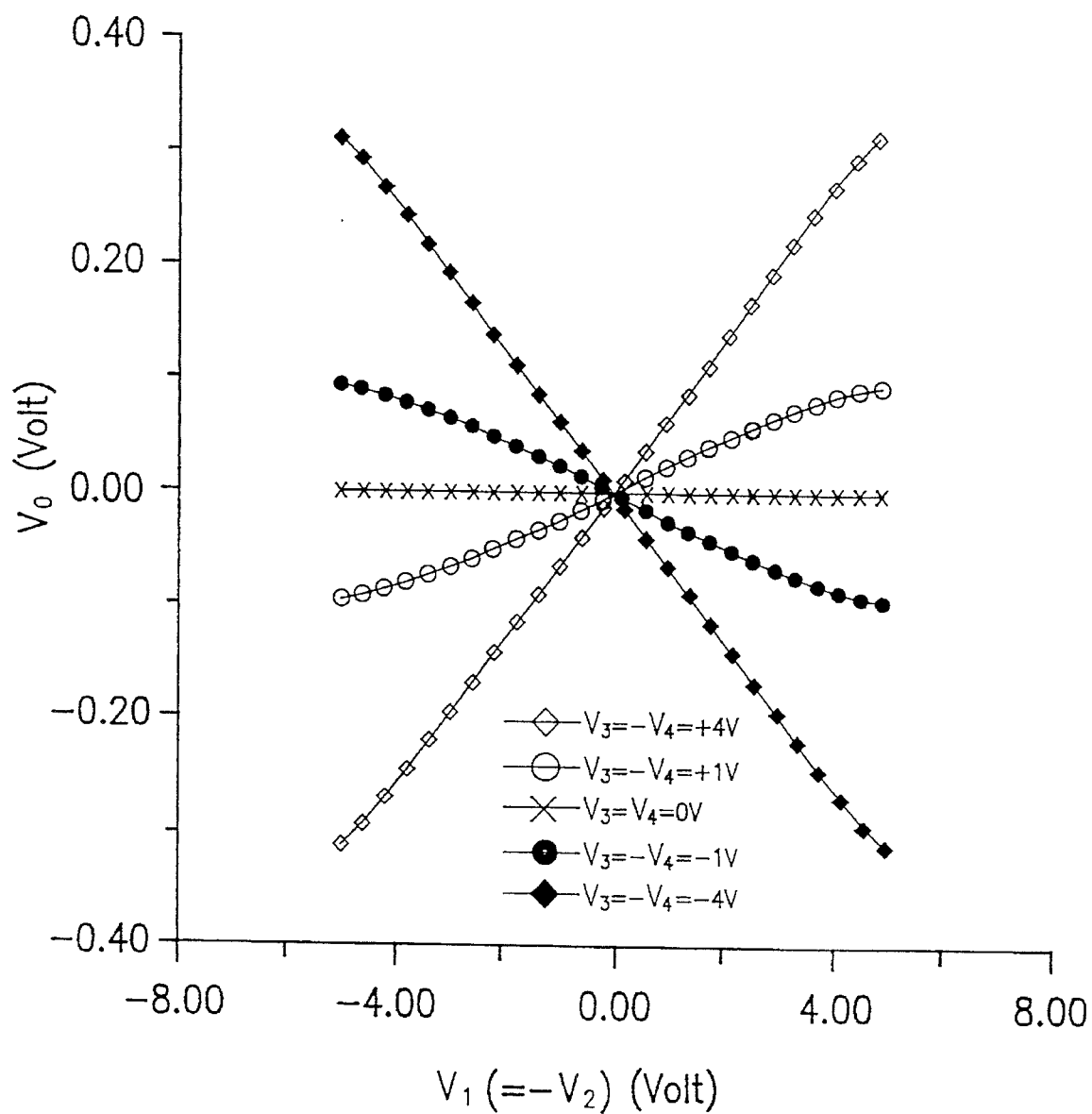
FIG. 3 is a graph displaying the transfer curve of the four-quadrant multiplier shown in FIG. 2 after simulation.

FIG. 3 is a graph showing the performance of the four-quadrant multiplier according to the present invention after simulating by the SPICE program with the parameters of 2 μm BiCMOS process. The simulating parameters are: $V_{DD}/V_{SS}=\pm5$ V, $R_L=1$ kΩ, the aspect ratio of transistors M1–M4= 5/5 (μm), the aspect ratio of transistors M5, M7=5/10 (μm), and the aspect ratio of transistors M6 and M8=5/5 (μm). The transfer curve shown in FIG. 3 is obtained under the condition of signals $V_1=-V_2$, $V_3=-V_4$. The simulated results reveal that the operation is linear up to ±4 V with a nonlinearity error of less than 1%. For example, in the case of the signals $V_3=-V_4=4$ V, the THD (Total Harmonic Distortion) parameters are 0.331%, 0.369%, 0.735%, 3.04% with respect to the signal $V_1$ to be 1, 2, 3, 4 V, respectively. Furthermore, according to the simulation results, the −3 dB bandwidth is about 222 Mhz.

Figure 4:
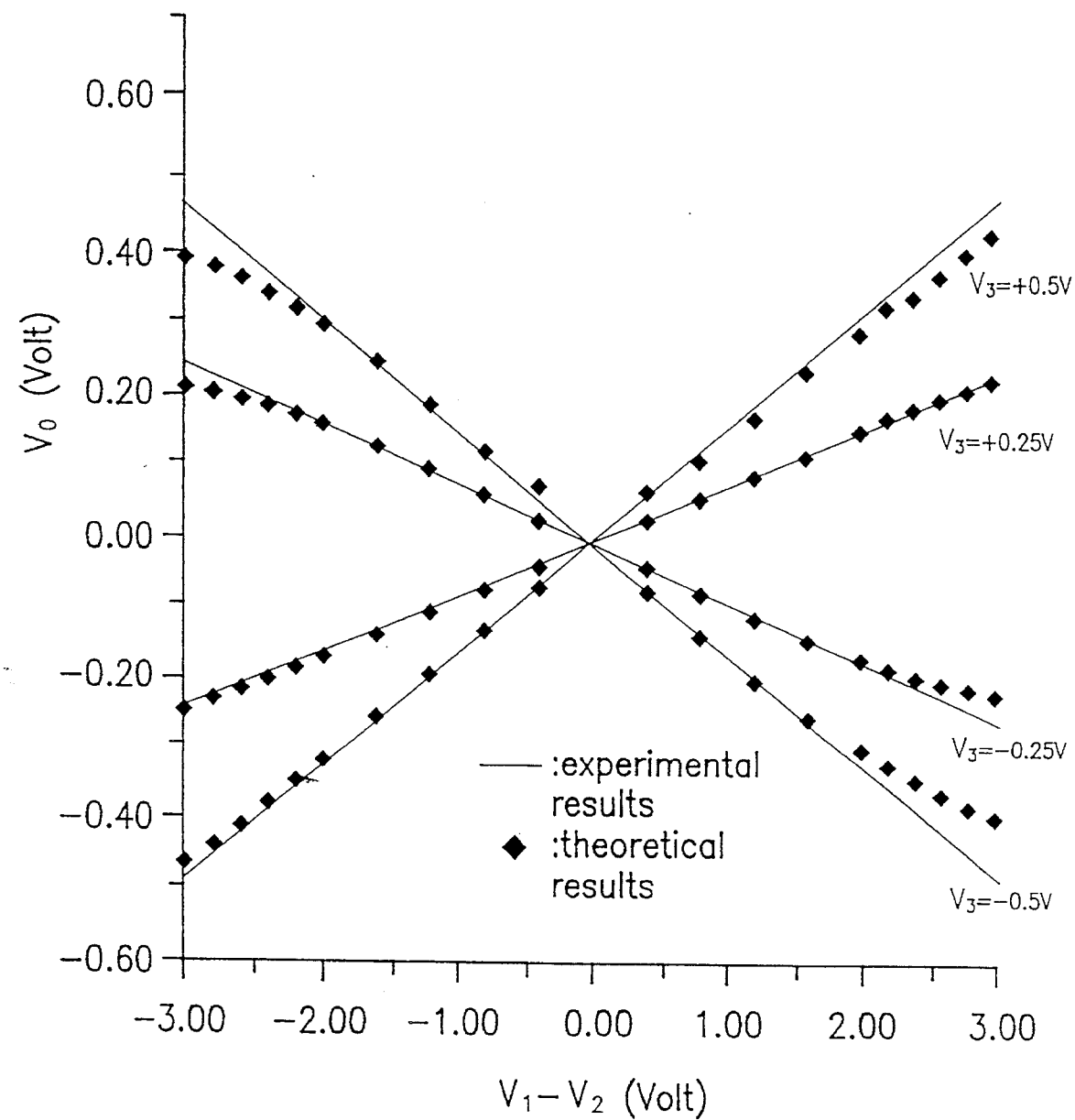
FIG. 4 is a graph displaying the transfer curve of the four-quadrant multiplier shown in FIG. 1 after experimentation.

We used discrete devices (CA3096 and CD4007) to constitute the four-quadrant multiplier according to the structure shown in FIG. 1 to test its performance, and the results are depicted in FIG. 4. In FIG. 1, the abscissa represents the magnitude of the signal $V_1-V_2$ and the ordinate the voltage of the output signal $V_0$, in the case of $V_4=0$ V and $V_3=\pm0.25$ V or $\pm0.5$ V. It faithfully reveals that the experimental results are very close to the theoretical results under most testing conditions. However, the major components in the four-quadrant multiplier according to the present invention should have the same device characteristics, and such a circuit ideally should be embodied in integrated circuits in order to meet the requirements of the multiplication operation.

Advantages of the present invention are described as follows:

1. It possesses both the merits of bipolar circuits and CMOS circuits. As with bipolar technology, it is suitable for high-frequency applications and has a high current-driving capacity. On the other hand, as with CMOS technology, it requires less power consumption and occupies less chip area.

2. It only requires simple components for construction. There are four NPN bipolar transistors, four PMOS transistors, and 4 NMOS transistors in the configuration shown in FIG. 1. There are even fewer components in the configuration of FIG. 2, with two NPN bipolar transistors. Compared to the conventional four-quadrant multiplier, the present invention requires substantially fewer components to build.

The foregoing description of preferred embodiments the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the act to understand the invention for various embodiments and with various modifications as are suited to the particular use contemplated. It is intended that the scope of the invention be defined by the following claims and their equivalents.

What is claimed is:

1. A four-quadrant multiplier, receiving a first input signal, a second input signal, a third input signal, and a fourth input signal, for calculating the product of the voltage difference between said first input signal and said second input signal as well as that between said third input signal and said fourth input signal, and outputting the result to an output port, said four-quadrant multiplier comprising:

a first terminal to receive a high potential;

a second terminal to receive a low potential;

a first transform means for receiving said first input signal and outputting a first intermediate signal;

a second transform means for receiving said second input signal and outputting a second intermediate signal, the voltage difference between said first input signal and said second input signal being proportional to the voltage difference between said first intermediate signal and said second intermediate signal;

a first squaring means for squaring, coupled between a positive terminal of said output port and said second terminal, said first squaring means receiving said third input signal and said first intermediate signal and generating a first output current which is proportional to the square of a value representing the voltage difference between said third input signal and said first intermediate signal minus a reference voltage, said first squaring means including a first bipolar transistor operated in the active region, a base of said first bipolar transistor receiving said third input signal and a collector of said first bipolar transistor being coupled to said positive terminal of said output port, and a first MOS transistor operated in the saturation region, a gate of said first MOS transistor receiving said first intermediate signal, a source of said first MOS transistor being coupled to an emitter of said first bipolar transistor, and a drain of said first MOS transistor being coupled to said second terminal;

a second squaring means for squaring, coupled between a negative terminal of said output port and said second terminal, said second squaring means receiving said third input signal and said second intermediate signal and generating a second output current which is proportional to the square of a value representing the voltage difference between said third input signal and said second intermediate signal minus said reference voltage, said second squaring means including a second bipolar transistor operated in the active region, a base of said second bipolar transistor receiving said third input signal, and a collector of said second bipolar transistor being coupled to said negative terminal of said output port, and a second MOS transistor operated in the saturation region, a gate of said second MOS transistor receiving said second intermediate signal, a source of said second MOS transistor being coupled to an emitter of said second bipolar transistor, and a drain of said second MOS transistor being coupled to said second terminal;

a third squaring means for squaring, coupled between said negative terminal of said output port and said second terminal, said third squaring means receiving said fourth input signal and said first intermediate signal and generating a third output current which is proportional to the square of a value representing the voltage difference between said fourth input signal and said first intermediate signal minus said reference voltage, said third squaring means including a third bipolar transistor operated in the active region, a base of said third bipolar transistor receiving said fourth input signal, and a collector of said third bipolar transistor being coupled to said negative terminal of said output port, and a third MOS transistor operated in the saturation region, a gate of said third MOS transistor receiving said first intermediate signal, a source of said third MOS transistor being coupled to an emitter of said third bipolar transistor, and a drain of said third MOS transistor being coupled to said second terminal;

a fourth squaring means for squaring, coupled between said positive terminal of said output port and said second terminal, said fourth squaring means receiving said fourth input signal and said second intermediate signal and generating a fourth output current which is proportional to the square of a value representing the voltage difference between said fourth input signal and said second intermediate signal minus said reference voltage, said fourth squaring means including a fourth bipolar transistor operated in the active region, a base of said fourth bipolar transistor receiving said fourth input signal, and a collector of said fourth bipolar transistor being coupled to said positive terminal of said output port, and a fourth MOS transistor operated in the saturation region, a gate of said fourth MOS transistor receiving said second intermediate signal, a source of said fourth MOS transistor being coupled to an emitter of said fourth bipolar transistor, and a drain of said fourth MOS transistor being coupled to said second terminal;

a first load means for loading, coupled between said first terminal and said positive terminal of said output port and serving as a load for said first output current and said fourth output current; and a second load means for loading, coupled between said first terminal and said negative terminal of said output port, serving as a load for said second output current and said third output current, said second load means having a resistance which is equal to that of said first load means.

2. The four-quadrant multiplier of claim 1, wherein said first transform means comprises:

a fifth MOS transistor operated in the saturation region, a gate of said fifth MOS transistor receiving said first input signal, and a drain of said fifth MOS transistor being coupled to said first terminal; and a sixth MOS transistor operated in the saturation region, a connected gate and drain of said sixth MOS transistor being coupled to a source of said fifth MOS transistor and carrying a signal serving as said first intermediate signal, and a source of said sixth MOS transistor being coupled to said second terminal.

3. The four-quadrant multiplier of claim 1, wherein said second transform means comprises:

a seventh MOS transistor operated in the saturation region, a gate of said seventh MOS transistor being coupled to said second input signal, and a drain of said seventh MOS transistor being coupled to said first terminal; and an eight MOS transistor operated in the saturation region, a connected gate and drain of said eighth MOS transistor being coupled to a source of said seventh MOS transistor and carrying a signal serving as said second intermediate signal, and a source of said eighth MOS transistor being coupled to said second terminal.

4. The four-quadrant multiplier of claim 1, wherein said first load means is a resistor.

5. The four-quadrant multiplier of claim 1, wherein said second load means is a resistor.

6. The four-quadrant multiplier of claim 1, wherein said reference voltage is the sum of a base-emitter voltage of a bipolar transistor operated in the active region and a threshold voltage of a MOS transistor.

7. A four-quadrant multiplier, receiving a first input signal, a second input signal, a third input signal, and a fourth input signal, for calculating the product of the voltage difference between said first input signal and said second input signal as well as that between said third input signal and said fourth input signal, and outputting the result to an output port, said four-quadrant multiplier comprising:

a first terminal to receive a high potential;

a second terminal to receive a low potential;

a first transform means for receiving said first input signal and outputting a first intermediate signal;

a second transform means for receiving said second input signal and outputting a second intermediate signal, the voltage difference between said first input signal and said second input signal being proportional to the voltage difference between said first intermediate signal and said second intermediate signal;

a first squaring means for squaring, coupled between a negative terminal of said output port and said first terminal, said first squaring means receiving said third input signal and said first intermediate signal and generating a first output current which is proportional to the square of a value representing the voltage difference between said third input signal and said first intermediate signal minus a reference voltage, said first squaring means including a first bipolar transistor operated in the active region, a base of said first bipolar transistor receiving said third input signal and a collector of said first bipolar transistor being coupled to said first terminal, and a first MOS transistor operated in the saturation region, a gate of said first MOS transistor receiving said first intermediate signal, a source of said first MOS transistor being coupled to an emitter of said first bipolar transistor, and a drain of said first MOS transistor being coupled to said negative terminal of said output port;

a second squaring means for squaring, coupled between a positive terminal of said output port and said first terminal, said second squaring means receiving said third input signal and said second intermediate signal and generating a second output current which is proportional to the square of a value representing the voltage difference between said third input signal and said second intermediate signal minus said reference voltage, said second squaring means including a second MOS transistor operated in the saturation region, a gate of said second MOS transistor receiving said second intermediate signal, a source of said second MOS transistor being coupled to an emitter of said first bipolar transistor, and a drain of said second MOS transistor being coupled to said positive terminal of said output port;

a third squaring means for squaring, coupled between said positive terminal of said output port and said first terminal, said third squaring means receiving said fourth input signal and said first intermediate signal and generating a third output current which is proportional to the square of a value representing the voltage difference between said fourth input signal and said first intermediate signal minus said reference voltage, said third squaring means including a second bipolar transistor operated in the active region, a base of said second bipolar transistor receiving said fourth input signal, and a collector of said second bipolar transistor being coupled to said first terminal, and a third MOS transistor operated in the saturation region, a gate of said third MOS transistor receiving said first intermediate signal, a source of said third MOS transistor being coupled to an emitter of said second bipolar transistor, and a drain of said third MOS transistor being coupled to said positive terminal of said output port;

a fourth squaring means for squaring, coupled between said negative terminal of said output port and said first terminal, said fourth squaring means receiving said fourth input signal and said second intermediate signal and generating a fourth output current which is proportional to the square of a value representing the voltage difference between said fourth input signal and said second intermediate signal minus said reference voltage, said fourth squaring means including a fourth MOS transistor operated in the saturation region, a gate of said fourth MOS transistor receiving said second intermediate signal, a source of said fourth MOS transistor being coupled to an emitter of said fourth bipolar transistor, and a drain of said fourth MOS transistor being coupled to said negative terminal of said output port;

a first load means for loading, coupled between said second terminal and said positive terminal of said output port and serving as a load for said second output current and said third output current; and a second load means for loading, coupled between said second terminal and said negative terminal of said output port, serving as a load for said first output current and said fourth output current, said second load means having a resistance which is equal to that of said first load means.

8. The four-quadrant multiplier of claim 7, wherein said first transform means comprises:

a fifth MOS transistor operated in the saturation region, a gate of said fifth MOS transistor receiving said first input signal, and a drain of said fifth MOS transistor being coupled to said first terminal; and a sixth MOS transistor operated in the saturation region, a connected gate and drain of said sixth MOS transistor being coupled to a source of said fifth MOS transistor and carrying a signal serving as said first intermediate signal, and a source of said sixth MOS transistor being coupled to said second terminal.

9. The four-quadrant multiplier of claim 7, wherein said second transform means comprises:

a seventh MOS transistor operated in the saturation region, a gate of said seventh MOS transistor receiving said second input signal, and a drain of said seventh MOS transistor being coupled to said; first terminal; and an eighth MOS transistor operated in the saturation region, a connected gate and drain of said eighth MOS transistor being coupled to a source of said seventh MOS transistor and carrying a signal serving as said second intermediate signal, and a source of said eighth MOS transistor being coupled to said second terminal.

10. The four-quadrant multiplier of claim 7, wherein said first load means is a resistor.

11. The four-quadrant multiplier of claim 7, wherein said second load means is a resistor.

12. The four-quadrant multiplier of claim 7, wherein said reference voltage is the sum of a base-emitter voltage of a bipolar transistor operated in the active region and a threshold voltage of a MOS transistor.

* * * * *